US009553553B2

United States Patent
Christoph

(10) Patent No.: US 9,553,553 B2
(45) Date of Patent: Jan. 24, 2017

(54) ENGINE SOUND SYNTHESIS SYSTEM

(71) Applicant: Harman Becker Automotive Systems GmbH, Karlsbad (DE)

(72) Inventor: Markus Christoph, Straubing (DE)

(73) Assignee: Harman Becker Automotive Systems GmbH, Karlsbad (DE)

( * ) Notice: Subject to any disclaimer, the term of this patent is extended or adjusted under 35 U.S.C. 154(b) by 612 days.

(21) Appl. No.: 13/940,884

(22) Filed: Jul. 12, 2013

(65) Prior Publication Data
US 2014/0016792 A1 Jan. 16, 2014

(30) Foreign Application Priority Data

Jul. 12, 2012 (EP) .................................. 12 176 133

(51) Int. Cl.
*H03G 3/00* (2006.01)
*G10H 1/08* (2006.01)
(Continued)

(52) U.S. Cl.
CPC .................. *H03G 3/00* (2013.01); *G10H 1/08* (2013.01); *G10K 15/02* (2013.01); *G10L 19/06* (2013.01);
(Continued)

(58) Field of Classification Search
CPC .............. H03G 3/00; H03G 3/20; G10H 1/08; G10H 5/00; G10H 2210/066; G10H 2220/211; G10H 2250/235; G10H 2250/381; G10H 2250/471; G10K 15/02
(Continued)

(56) References Cited

U.S. PATENT DOCUMENTS

| 5,410,606 A | 4/1995 | Imai et al. |
| 5,999,897 A * | 12/1999 | Yeldener ................. G10L 25/90 704/207 |
| 2008/0267425 A1* | 10/2008 | Le Faucheur ....... G10L 21/0208 381/94.1 |

FOREIGN PATENT DOCUMENTS

| EP | 1 577 879 A1 | 9/2005 |
| WO | WO 01/33543 A1 | 5/2001 |
| WO | WO 2009/028790 A1 | 3/2009 |

OTHER PUBLICATIONS

Serra, "Musical Sound Modeling with Sinusoids plus Noise", in Musical Signal Processing, 1997, by publishers: Swets & Zeitlinger and editors: C. Roads, S. Pope, A. Picialli, G. De Poli, p. 1-25.*

(Continued)

*Primary Examiner* — Leshui Zhang
(74) *Attorney, Agent, or Firm* — Alleman Hall McCoy Russell & Tuttle LLP

(57) ABSTRACT

An engine sound synthesis system is operable to analyze sound. Operation of the system may include providing an input sound signal to be analysed and determining a fundamental frequency of the input signal from the input signal or from at least one guide signal. Furthermore, the frequencies of higher harmonics of the fundamental frequency are determined, thus determining harmonic model parameters. A harmonic signal based on the harmonic model parameters is synthesized and a residual signal is estimated by subtracting the harmonic signal from the input signal. Residual model parameters are estimated based on the residual signal. Furthermore, a corresponding method for synthesizing a sound signal is described.

32 Claims, 4 Drawing Sheets

(51) Int. Cl.
*G10K 15/02* (2006.01)
*G10L 19/06* (2013.01)

(52) U.S. Cl.
CPC ... *G10H 2210/066* (2013.01); *G10H 2220/211* (2013.01); *G10H 2250/235* (2013.01); *G10H 2250/381* (2013.01); *G10H 2250/471* (2013.01)

(58) Field of Classification Search
USPC .. 381/61, 62, 63, 320, 321, 97, 98, 99, 100, 381/101, 102, 103, 116, 117, 118, 119, 381/123, 302, 86; 700/94; 84/671, 675, 84/692, 697, 698; 704/500, 208
See application file for complete search history.

(56) References Cited

OTHER PUBLICATIONS

Smit, et al "Guided Harmonic Sinusoid Estimation in a Multi-Pitch Environment", IEEE Workshop on Applications of Signal Processing to Audio and Acoustics, Oct. 18-21, 2009, New Paltz, NY, p. 41-44.*

Extended European Search Report, dated Mar. 7, 2013, pp. 1-14, European Patent Application No. 12176133.2, European Patent Office, Munich, Germany.

Das, D.P., Panda, G., Kuo, S.M., "New block filtered-X LMS algorithms for active noise control systems," Jun. 7, 2007, pp. 73-81, IET Signal Process, vol. 1, No. 2, XP006028980, © The Institution of Engineering and Technology 2007.

Kuo, S.M., Tahernezhadi, M., Ji, L., "Frequency-Domain Periodic Active Noise Control and Equalization," Jul. 1, 1997, pp. 348-358, vol. 5, No. 4, XP011054259, IEEE Transactions on Speech and Audio Processing, IEEE Service Center, New York, NY © 1997 IEEE.

Smit, C., Ellis, D.P.W., "Guided Harmonic Sinusoid Estimation in a Multi-Pitch Environment," Oct. 18 to Oct. 21, 2009, pp. 1-4, 2009 IEEE Workshop on Applications of Signal Processing to Audio and Acoustics, New Paltz, NY.

Fastl, H., Zwicker, E., "Psychoacoustics Facts and Models," Springer Series in Information Sciences, Aug. 2006, pp. Preface -462, ISBN-10 3-540-65063-6 $2^{nd}$ Ed., Springer-Verlag Berlin Heidelberg New York, © Springer-Verlag Berlin Heidelberg, 1990, 1999, 2007.

* cited by examiner

ENGINE SOUND SYNTHESIS SYSTEM

PRIORITY CLAIM

This application claims the benefit of priority from European Patent Application No. 12 176 133, filed Jul. 12, 2012, which is incorporated by reference.

BACKGROUND OF THE INVENTION

1. Technical Field

The invention relates to the field of sound synthesis, particularly to synthesizing the sound of a combustion engine.

2. Related Art

The growing popularity of hybrids and electric vehicles gives rise to new safety issues in urban environments, as many of the aural cues associated with (combustion) engine noise can be missing. The solution is to intelligently make vehicles noisier. In fact, several countries have established laws which require vehicles to radiate a minimum level of sound in order to warn other traffic participants of an approaching vehicle.

SUMMARY

An engine sound synthesis system is capable of analyzing sound. In accordance with one example, operation of the system includes: providing an input sound signal to be analyzed and determining a fundamental frequency of the input signal from the input signal or from at least one guide signal. Furthermore, the frequencies of higher harmonics of the fundamental frequency are determined, thus determining harmonic model parameters. A harmonic signal based on the harmonic model parameters is synthesized and a residual signal is estimated by subtracting the harmonic signal from the input signal. Residual model parameters are estimated based on the residual signal.

Furthermore, engine sound synthesis system is also capable of synthesizing a sound signal. The synthesizing is based on harmonic model parameters and residual model parameters that may be, for example, determined in accordance with the previously described analysis of sound. In accordance with one example operation of the system includes: receiving at least one guide signal and calculating the fundamental frequency and frequencies of a number of higher harmonics based on the at least one guide signal. Furthermore, the residual model parameters and the harmonic model parameters that are associated with the calculated frequencies can be provided. A harmonic signal is synthesized using the harmonic model parameters for the calculated fundamental frequency, and frequencies of higher harmonics. Additionally, a residual signal is synthesized using the residual model parameters. The total sound signal can be calculated by superposing the synthesized harmonic signal and residual signal.

Other systems, methods, features and advantages will be, or will become, apparent to one with skill in the art upon examination of the following figures and detailed description. It is intended that all such additional systems, methods, features and advantages be included within this description, be within the scope of the invention, and be protected by the following claims.

BRIEF DESCRIPTION OF THE DRAWINGS

The engine sound synthesis system can be better understood with reference to the following drawings and descriptions. The components in the figures are not necessarily to scale, instead emphasis is placed upon illustrating the principles of the engine sound synthesis system. Moreover, in the figures, like reference numerals designate corresponding parts. In the drawings.

DETAILED DESCRIPTION OF THE PREFERRED EMBODIMENTS

Figure 1:
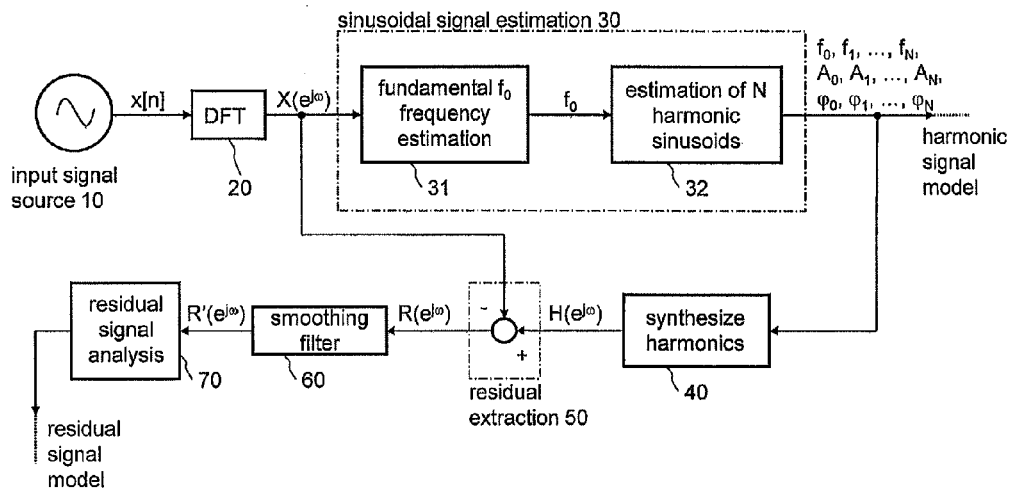
FIG. 1 is a block diagram illustrating an example of analyzing engine sound based on a sinusoid signal model.

Examples of the engine sound synthesis system are described below in the context of engine or motor sound synthesis. However, the methods for analyzing and synthesizing sound presented herein may also be applied outside the automotive field, as well as for other purposes. As mentioned above, it may be used for electric or hybrid vehicles to radiate a minimum level of sound to allow people, particularly pedestrians and people with reduced hearing capabilities, to hear an approaching vehicle. The typical sound of a combustion engine may also be desired in the interior of a vehicle to provide the driver with an acoustic feedback about the operational status of the vehicle (with regard to the throttle control or the like). The sound perceivable from the outside of a vehicle is dominated by the engine sound for a driving speed up to 30 to 40 km per hour. Therefore, particularly in urban regions where the driving speeds are low, the sound of the engine can be the dominant "alarm signal" that warns other traffic participants of an approaching vehicle.

In many applications, the signals of interest are composed of a plurality of sinusoidal signal components corrupted by broadband noise. For analyzing and modelling such signals a sinusoidal or "harmonic" model is appropriate. In addition, signals mainly consisting of sinusoidal components can be found in different applications such as, for example, formant frequencies in speech processing. Sinusoidal modelling may also be successfully applied for analysing and synthesizing the sound produced by musical instruments since they generally produce harmonic or nearly harmonic signals with relatively slowly varying sinusoidal components. Sinusoidal modelling offers a parametric representation of audible signal components such that the original signal can be recovered by synthesis, such as by addition (for example superposition) of the (harmonic and residual) components.

Rotating mechanical systems such as the combustion engine of a vehicle can have a high harmonic content plus a broadband noise signal and thus a model, such as a "sinusoids plus residual" model is suitable for analyzing and synthesizing the sound produced by a real world combustion engine. For this purpose the sound generated by a combustion engine may be recorded using one or more microphones positioned outside the vehicle while the vehicle is placed, for example, in a chassis roller dynamometer and operated in different load conditions and at various rotational engine speeds. The resulting audio data may be analyzed to "extract" model parameters from the audio data which may be later used (for example, in an electric vehicle) to reproduce the motor sound in an easy manner by using an appropriate audio signal generation device, such as a synthesizer. The model parameters are generally not constant, but may vary, for example particularly dependent on the rotational engine speed.

Some research has been conducted in the field of analyzing and synthesizing sound signals, particularly in the context of speech processing. However, the known methods and algorithms typically require powerful digital signal processors which are not suitable for low-cost applications, such as the applications used in the automotive industry. Thus there is a need for an efficient method for synthesizing sound, particularly the sound of a combustion engine.

FIG. 1 illustrates a engine sound synthesis system for analyzing an audio signal in the frequency domain to extract model parameters. The time discrete (with time index n) input signal x[n] is the audio data obtained by measurement using microphones as discussed above. In FIG. 1 the measurement is symbolized generally by an input signal source 10 providing the input signal x[n]. The signal x[n] is transformed into the frequency domain using a digital short-time Fourier transform (STFT) algorithm (such as an FFT algorithm). The function block that performs the STFT for generating the input signal $X(e^{j\omega})$ in the frequency domain is labelled with the reference numeral 20 in FIG. 1. Starting with the input signal $X(e^{j\omega})$ in the frequency domain all the following signal analysis can be conducted in the frequency domain. The signal processing is, however, not limited to the frequency domain. The signal processing may be performed partially or even exclusively in the time domain. When using frequency domain signal processing the number of harmonic sinusoids is, however, only limited by the FFT-length used.

In accordance with the engine sound synthesis system illustrated in FIG. 1 the input signal $X(e^{j\omega})$ is supplied to a function block, which is a sinusoidal signal estimation module 30 performing the estimation of the sinusoidal signal components. In the present example this function is divided in two parts, namely the estimation of the fundamental frequency $f_0$ using a function block, which is a frequency estimation unit 31, and estimation of the N harmonic sinusoids using a function block, which is a harmonic sinusoids unit 32 having the frequencies $f_1, f_2, \ldots, f_N$. Examples of methods known in the field for accomplishing this task are not further discussed here in detail. Such methods can, however, be based on a signal model which can be expressed as follows:

$$x[n] = A_0 \cdot \sin(\omega_0 n + \phi_0) + A_1 \cdot \sin(\omega_1 n + \phi_1) + \ldots + A_N \cdot \sin(\omega_N n + \phi_N) + r[n] \quad (1)$$

That is, the input signal x[n] can be modeled as a superposition of the following: a sinusoid signal having the fundamental frequency $f_0$ (corresponds to the angular frequency $\omega_0$), N harmonic sinusoids having the frequencies $f_1$ to $f_N$ (correspond to the angular frequencies $\omega_1$ to $\omega_N$, respectively), and a broadband, non-periodic residual signal r[n]. The result of the sinusoidal signal estimation module (block 30) can be three corresponding vectors including the estimated frequencies $f=(f_0, f_1, \ldots, f_N)$ as well as the corresponding magnitudes $A=(A_0, A_1, \ldots, A_N)$ and phase values $\phi=(\phi_0, \phi_1, \ldots, \phi_N)$, wherein the phase $\phi_0$ of the fundamental frequency may be set to zero. These vectors f, A, $\phi$ containing frequency, magnitude, and phase values may be determined for various different fundamental frequencies, such as corresponding to rotational speeds of the engine of, for example, 900 rpm, 1000 rpm, 1100 rpm, or any other rotational speed which corresponds to a fundamental frequency. Further, the vectors f, A, $\phi$ may be determined for different engine loads or for other non-acoustical parameters (gear number, reverse gear active, or any other parameters) which represent the operational mode of the engine.

Each module and/or unit described herein, such as the sinusoidal signal estimation module 30, frequency estimation unit 31, and the harmonic sinusoids unit 32 is hardware, or a combination of hardware and software. For example, each module or unit may include and/or initiate execution of an application specific integrated circuit (ASIC), a Field Programmable Gate Array (FPGA), a circuit, a digital logic circuit, an analog circuit, a combination of discrete circuits, gates, or any other type of hardware, or combination thereof. Accordingly, as used herein, execution of a module or unit by a processor can also refer to logic based processing by the module or unit that is initiated directly or indirectly by a processor to complete a process or obtain a result. Alternatively or in addition, each module or unit can include memory hardware, such as at least a portion of a memory, for example, that includes instructions executable with a processor to implement one or more of the features of the module or unit. When any one of the modules or units includes instructions stored in memory and executable with the processor, the module or unit may or may not include the processor. In some examples, each module or unit may include only memory storing instructions executable with a processor to implement the features of the corresponding module or unit without the module or unit including any other hardware. Because each module or unit includes at least some hardware, even when the included hardware includes software, each module or unit may be interchangeably referred to as a hardware module or hardware unit, such as the sinusoidal signal estimation hardware module, the frequency estimation hardware unit, and the harmonic sinusoids hardware unit.

To estimate the residual signal r[n], which may also be dependent on one or more non-acoustical parameters (gear number, reverse gear active, etc.), the estimated model parameters, such as the vectors f, A, and $\phi$ are used to synthesize the total (estimated) harmonic content of the input signal by combining them, such as by superposition of the individual sinusoids. This is accomplished by a block which is the synthesize harmonics unit 40 in FIG. 1, and the resulting estimated harmonic portion of the input signal is denoted as $H(e^{j\omega})$ in the frequency domain and as h[n] in the time domain. In FIG. 1, the synthesized signal $H(e^{j\omega})$ is subtracted with an extraction module 50 from the input signal $X(e^{j\omega})$ to obtain the residual signal $R(e^{j\omega})$, which is the frequency domain equivalent of the time domain signal r[n] mentioned before. The residual signal may be subject to filtering with a filter (such as filtering with a non-linear smoothing filter 60). Such a filter should be configured to smooth the residual signal, to suppress, for example, transient artifacts, spikes, or the like in the estimated residual signal $R(e^{j\omega})$. The filtered residual signal $R'(e^{j\omega})$ is supplied to a block which is a residual signal analysis unit 70. The residual signal analysis unit 70 represents the signal analysis performed to obtain model parameters characterizing the residual signal. This signal analysis may include, for example, linear predictive coding (LPC) or the calculation of the power spectrum of the residual signal. For example, the power spectrum of the residual signal may be calculated in different spectral regions (frequency bands in accordance to a psycho-acoustically motivated frequency scale, see, for example, Fastl, Hugo; Zwicker, Eberhard; *Psychoacoustics* (3rd. edition), Springer, 2007) which may be chosen to consider psycho-acoustically critical band limits. Using a psycho-acoustically motivated frequency scale such as the Bark or the Mel scale allows a massive reduction in computation time and memory usage.

Having thus obtained the "harmonic" signal model parameters for different fundamental frequencies as well as the residual signal model parameters for different non-acoustical parameters (such as rotational speed values of the engine, gear number, engine load, or other vehicle engine related parameters), these model parameters may later be used to synthesize a realistic engine sound which corresponds to the sound produced by the engine analysed in accordance with FIG. 1.

Figure 2:
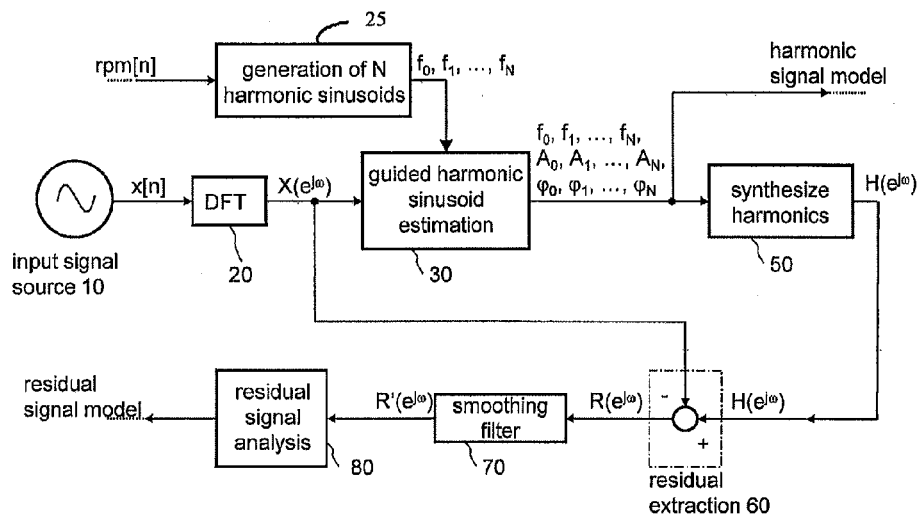
FIG. 2 is a block diagram illustrating an example of analyzing engine sound based on a model which utilizes an external guiding signal for estimating the harmonic sinusoid signal content that is present in an input signal.

FIG. 2 illustrates another example of the signal analysis which can be an alternative to the signal analysis in accordance with FIG. 1. Basically the structure of the signal analysis of FIG. 2 substantially corresponds to the signal analysis of FIG. 1. One difference, however, is the functional principles of the sinusoidal signal estimation module 30. The remaining parts of the block diagram of FIG. 2 are substantially identical with the example of FIG. 1. In the present example a guided harmonic sinusoid estimation is performed by the sinusoidal signal estimation module 30 using a guide signal, such as, for example, the rpm signal rpm[n]. In this context the rpm signal is generally a signal representing the rotational speed of the engine, which may be provided, for example, by the engine control unit (also known as power train control module which is usually accessible in many vehicles via a communication bus, such as a CAN bus, (CAN=controller area network). When using a guided sinusoid estimation the fundamental frequency is not estimated from the input signal $X(e^{j\omega})$ but rather may be directly obtained from the guide signal which is, in the present example, the rpm signal rpm[n] of the engine under test. For example, an engine speed of 1200 revolutions per minute may result in a fundamental frequency of 120 Hz for a six-cylinder combustion engine.

For a guided sinusoid signal estimation the following signal model may be used. Accordingly, the input signal x[n] can be modelled as:

$$x[n] = \sum_{i=1,2,...} A_i \cdot \sin(2\pi \cdot i \cdot f_0 \cdot n + \varphi_i) \quad (2)$$

wherein n is the time index, i denotes the number of the harmonic, $f_0$ denotes the fundamental frequency, and $A_i$ and $\phi_i$ are the amplitude and phase, respectively, of the $i^{th}$ harmonic. As mentioned above, the fundamental frequency and the frequencies of the higher harmonics are not estimated from the input signal x[n] but can be directly derived from the guide signal, for example, rpm[n]. This functionality of estimating the fundamental frequency and the frequencies of higher harmonics is represented by the block, which is a harmonic sinusoids generation module 25 labelled "generation of N harmonic sinusoids" in FIG. 2, which may be included as part of the sinusoidal signal estimation module 30. The corresponding amplitude A, and phase values $\phi_i$ are estimated using signal processing methods such as, signal processing methods known in the field.

For example, Fast Fourier Transform (FFT) algorithms may be used or alternatively, the Goertzel algorithm may be used if only a few harmonics are to be estimated. A predetermined number, such as a fixed number N of frequencies may be considered. One example of guided harmonic estimation in the context of speech processing is described in Christine Smit and Daniel P. W. Ellis, *GUIDED HARMONIC SINUSOID ESTIMATION IN A MULTI-PITCH ENVIRONMENT*, in: 2009 *IEEE Workshop on Applications of Signal Processing to Audio and Acoustics*, Oct. 18-21, 2009.

Figure 3:
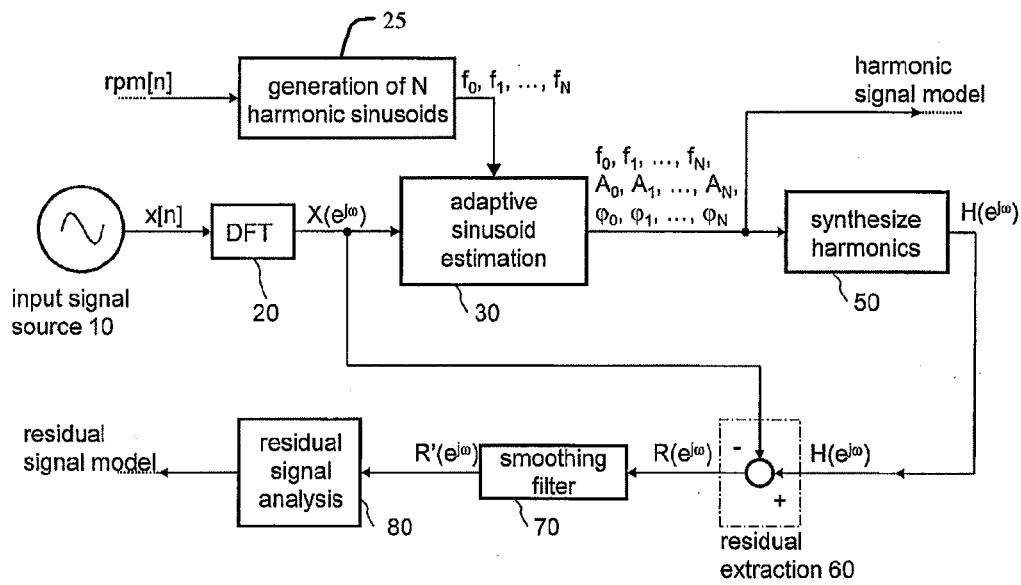
FIG. 3 is a block diagram of another example of analyzing engine sound using an adaptive guided estimation of the harmonic sinusoid signal content.

FIG. 3 illustrates a modification of the example presented in FIG. 2. Both block diagrams are substantially identical except the signal processing block, which is the adaptive sinusoid estimation module 30 that generates the sinusoidal signal estimation. In this example, guided adaptive sinusoid estimation algorithms use the frequency vector f including the fundamental frequency $f_0$ and the frequency of at least one higher harmonic ($f_1$, $f_2$, . . . ) as parameters and adaptively "fine-tune" these frequencies to best match the input signal $X(e^{j\omega})$ using the harmonic sinusoids generation module 25, which may be included as part of the sinusoidal signal estimation module 30. Accordingly, the estimation provides a modified frequency vector f' including the fine-tuned frequencies $f_0'$, $f_1'$, . . . , as well as the corresponding modified amplitude vector A'=[$A_0'$, $A_1'$, $A_2'$, . . . ] and modified phase vector $\phi=[\phi_0', \phi_1', \phi_2', \ldots]$. An adaptive module, which may include an algorithm, may be used in place of, or in conjunction with the guide signal, particularly in cases when the guide signal (such as the rpm signal rpm[n]) is of insufficient quality. Mechanical systems such as the power train of an automobile usually have a very high Q-factor and thus even small deviations (in the range of a few Hertz) between, for example, the rpm signal rpm [n] and the true engine speed may significantly deteriorate the estimation result, particularly for higher harmonics.

Figure 4:
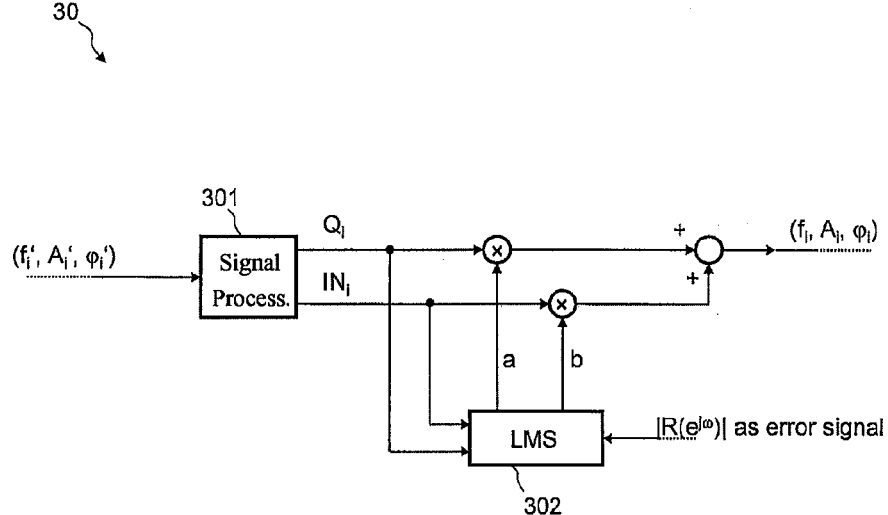
FIG. 4 is a block diagram illustrating an example of adaptation of a harmonic sinusoid signal component in the example of FIG. 3.

FIG. 4 is a block diagram illustrating an example for adapting a frequency $f_i$ (i=1, . . . , N) component (as well as its amplitude $A_i$ and its phase $\phi_i$) included in the frequency vector f using an optimization procedure, such as a least mean square (LMS) optimization algorithm. The result of the adaptation is a "fine-tuned" sinusoid represented by a triple phasor $f_i'$, $A_i'$, $\phi_i'$ of modified vectors. The starting point for the adaptation is a sinusoid (represented by the triple phasor $f_i$, $A_i$, $\phi_i$) estimated using the basic approach as described with reference to FIG. 2. That is, the initial modified values $f_i'$, $A_i'$, $\phi_i'$, which are then optimized using the adaptive module included in the sinusoidal signal estimation module 30, which may include an algorithm, as described herein. The initial modified values $f_i'$, $A_i'$, $\phi_i'$, may be obtained using a guided harmonic sinusoid estimation in which the frequencies $f_i$ (i=1, 2, . . . , N) are simply calculated as multiples of the fundamental frequency ($f_0$), which can be directly derived from a (non-acoustical or acoustical) guide signal, such as from a rotational speed signal in an automotive application using the. For the adaptation the initial sinusoid represented by the triple phasor $f_i$, $A_i$, $\phi_I$ is regarded as phasor which is decomposed into a quadrature and an in-phase component $Q_i$, $IN_i$ (using the signal processing module 301). These components $Q_i$, $IN_i$ can be weighted by time-variant weighing factors a and b, respectively, and then summed (complex number addition, such as $IN_i+j\cdot Q_i$, j being the imaginary unit) to obtain the modified (optimized) phasor represented by the triple phasor $f_i'$, $A_i'$, $\phi_i'$.

The weighing factors a, b can be determined by the optimization module 302, which may be a least mean square (LMS) optimization module. The optimization module 302 is configured to adjust the weighing factors a and b such that an error signal is minimized (in a least square sense, such as an $l^2$ norm of the signal is minimized). The residual signal $R(e^{j\omega})$ obtained using the residual extraction 60 shown in FIG. 3 may be used as error signalOne "goal" of the adaptation is to minimize the power of the residual signal $R(e^{j\omega})$ and to maximize the total power of the harmonic signal component. The actual optimization algorithm may be any minimization algorithm, such as an LMS algorithm, which is based on the a predetermined method, such as the "steepest gradient" method. All these methods are themselves known and therefore not discussed in detail here.

The signal analysis illustrated in FIGS. 1 to 3 may be performed "off-line", such as with a test setup, such as a vehicle on a chassis roller dynamometer. During the test, the mentioned model parameters (i.e., frequency, amplitude and phase vectors f, A, and $\phi$ as well as the residual model parameters) may be measured for various different rpm values of the engine of the vehicle. For example, the model parameters may be determined for discrete rpm values ranging from a minimum value (such as 900 rpm) to a maximum value (such as 6000 rpm) in intervals of, for example, 100 rpm. If for later sound synthesis the model parameters are required for an intermediate rpm value (such as 2575 rpm), the model parameters may be obtained by, for example, interpolation. In the present example the model parameters for 2575 rpm may be calculated from the model parameters determined for 2500 rpm and 2600 rpm using linear interpolation.

In order to determine the model parameters, the rotational speed of the engine of the vehicle under test may be continuously ramped up from the minimum to the maximum rpm value. In this case the model parameters determined for rpm values within a given interval (such as from 950 rpm to 1049 rpm) may be averaged and associated with the center value of the interval (such as 1000 rpm in the present example). If other or additional guide signals (e.g. engine load) are to be considered, the data acquisition and model parameter estimation is performed analogously to the case described with regard to the rpm signal as guide signal.

Figure 5:
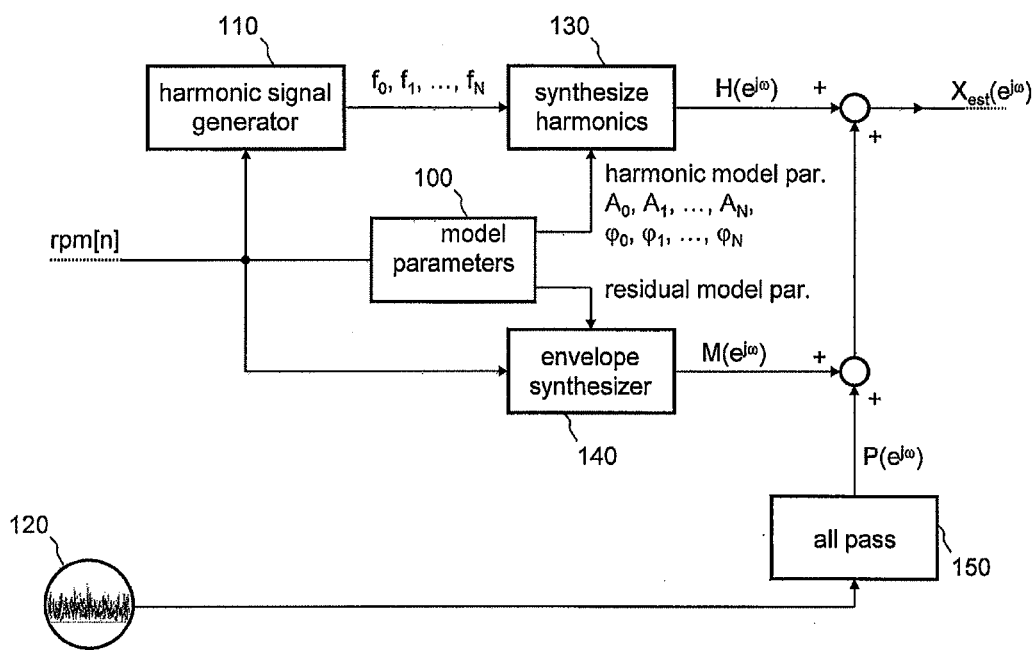
FIG. 5 is a block diagram illustrating the synthesis of engine sound using signal models obtained by the signal analysis in accordance with one of the examples of FIGS. 1 to 3.

FIG. 5 is a block diagram illustrating an example of an engine sound synthesis module that makes use of the model parameters determined in accordance with the signal analysis illustrated in the examples of FIGS. 1 to 3. In the present example only one guide signal (such as the rpm signal rpm[n]) is used. However, other guide signals may be used additionally or alternatively. The guide signal, such as the rpm[n], can be supplied to a harmonic signal generator module 110 and to a model parameter database module 100 included in the engine sound synthesis module. The harmonic signal generator module 110 is configured to provide the fundamental frequency $f_0$ and the frequencies $f_1, f_2, \ldots$ of the higher harmonics. These frequency values or, in other words, the frequency vector $f=[f_0, f_1, \ldots, f_N]$ is supplied to a harmonic signal synthesizer module 130 included in the engine sound synthesis module. The synthesizer module 130 can also receive the harmonic model parameters which fit to the current guide signal, such as the rpm[n], from the model parameter database module 100. The model parameter database module 100 also can also provide the model parameters which describe the residual model, such as the power spectrum of the residual signal. Further, the model parameter database module 100 may use interpolation to obtain the correct parameters as already mentioned. The harmonic signal synthesizer 130 is configured to provide a harmonic signal $H_{est}(e^{j\omega})$ that corresponds to the harmonic content of the input signal $X(e^{j\omega})$ which has been estimated therefrom using the signal analysis as described above with respect to FIGS. 1 to 3.

The model parameters describing the residual signal are provided to a envelope synthesizer module 140 included in the engine sound synthesis module, which recovers the magnitude $M(e^{j\omega})$ of the residual signal. In the present example the phase of the residual signal is recovered by filtering with a filter module 150, such as all-pass filtering white noise (thus obtaining the phase signal $P(e^{j\omega})$) and adding the phase signal $P(e^{j\omega})$ to the magnitude signal $M(e^{j\omega})$ so as to generate the total residual signal $R_{est}(e^{j\omega})$. The white noise is generated by a noise generator module 120 included in, or external to the engine sound synthesis module. The filter module 150 may be an all pass filter that implements a phase filter by mapping the white noise supplied to the filter input into the phase region 0 to $2\pi$ thus providing the phase signal $P(e^{j\omega})$. The synthesized engine sound signal $X_{est}(e^{j\omega})$ can then be obtained by adding the recovered harmonic signal $H_{est}(e^{j\omega})$ and the recovered residual signal $R_{est}(e^{j\omega})$. The resulting sound signal in the frequency domain may then be transformed to the time domain, amplified and reproduced using common audio reproduction devices.

Below some aspects of the engine sound synthesis system are summarized. It should be noted, however, that the following discussion is not regarded to be exhaustive or complete.

One aspect of operation of the engine sound synthesis system relates to analyzing sound, such as engine sound signals picked up near a combustion engine. The engine sound synthesis system can also determine a fundamental frequency of an input signal to be analyzed, thereby making use of the input signal or at least one guide signal. Furthermore, the frequencies of higher harmonics of the fundamental frequency can be determined, thus obtaining harmonic model parameters. The engine sound synthesis system further includes synthesizing a harmonic signal based on the harmonic model parameters and subtracting the harmonic signal from the input signal to obtain a residual signal. Finally, residual model parameters can be estimated based on the residual signal.

The input signal may be transformed to the frequency domain, thus providing a frequency domain input signal, before being further processed. In this case the number of higher harmonics which can be considered is only limited to the length of the input vectors used, e.g., by the FFT (fast Fourier transform) algorithm that provides the transformation into the frequency domain. Generally, the processing of an input signal may be fully performed in the frequency domain and thus the harmonic signal and the residual signal may also be calculated in the frequency domain.

The fundamental frequency and the frequencies of the higher harmonics may be derived from the at least one guide signal, in order to avoid an estimation of the fundamental frequency (and of the frequencies of the higher harmonics) directly from the input signal which typically is computationally complex.

The harmonic model parameters may include a frequency vector (f) of the fundamental frequency and the frequencies of the higher harmonics, a corresponding amplitude vector (A), and a corresponding phase vector ($\phi$). Determining the harmonic model parameters may include estimating phase and amplitude values associated with the fundamental frequency and the frequencies of higher harmonics. Generally, determining the harmonic model parameters may include a fine-tuning of the fundamental frequency and the frequencies of the higher harmonics obtained from, or based on, the at least one guide signal. Such fine-tuning may entail an iterative modification of the frequencies of higher harmonics and their corresponding (estimated) amplitude and phase values such that a norm of the residual signal is minimized, such as an $L^2$ norm. This fine-tuning can be regarded as a kind of optimization process.

The residual signal may be filtered using a filter, such as a non-linear filter, to smooth the residual signal before estimating the residual model parameters. Determining the residual model parameters may include calculating the power spectrum of the residual signal. The power spectral density may be calculated for different frequency bands in accordance with a psycho-acoustically motivated frequency scale so as to consider psycho-acoustically critical band limits.

Another aspect of the engine sound synthesis system relates to a method for synthesizing a sound signal based on harmonic model parameters and residual model parameters, wherein the parameters may particularly be determined in accordance with the below summary description. Operation of the engine sound synthesis system may include the calculation of the fundamental frequency and frequencies of a number of higher harmonics based on the at least one guide signal. The residual model parameters and the harmonic model parameters that are associated with the calculated frequencies can be provided, and a harmonic signal can be synthesized using the harmonic model parameters for the calculated fundamental frequency and frequencies of higher harmonics. Furthermore, a residual signal can be synthesized using the residual model parameters. The total sound signal can then be calculated by superposing the synthesized harmonic signal and residual signal.

Pre-filtered white noise may be added to the total sound signal. Particularly, the pre-filtering may include the mapping of amplitude values of the white noise into the 0 to $2\pi$ phase range, thus generating a phase signal to be added to the total sound signal. Generally, synthesizing the residual signal may include the generation of a noise signal having a power spectral density which corresponds to a power spectral density represented by the residual model parameters.

Figure 6:
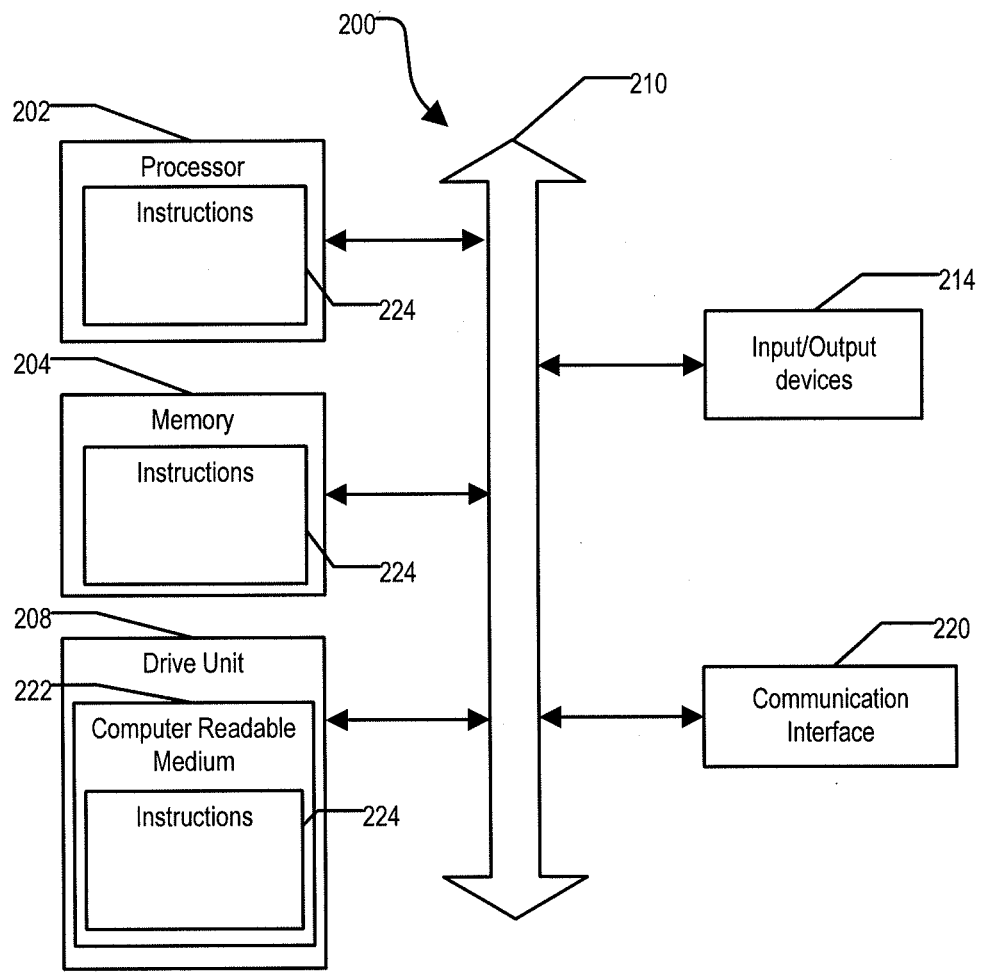
FIG. 6 illustrates an example block diagram of an example computer system that may be included or used with an aspect of an example engine sound synthesis system.

Furthermore, the engine sound synthesis system, or one or more aspects of the engine sound synthesis system, may include a portion or all of one or more computing devices of various kinds, such as the computer system 200 in FIG. 6. The computer system 200 may include a set of instructions that can be executed to cause the computer system 200 to perform any one or more of the methods or computer based functions disclosed herein, such as such any function provided by the engine sound synthesis system. The computer system 200 may operate as a standalone device or may be connected, such as, using a network, to other computer systems or peripheral devices.

The computer system 200 may be implemented using electronic devices that provide voice, audio, video or data communication. While a single computer system 200 is illustrated, the term "system" may include any collection of systems or sub-systems that individually or jointly execute a set, or multiple sets, of instructions to perform one or more computer functions.

The computer system 200 may include a processor 202, such as a central processing unit (CPU), a graphics processing unit (GPU), or both. The processor 202 may be a component in a variety of systems. Also, the processor 202 may include one or more general processors, digital signal processors, application specific integrated circuits, field programmable gate arrays, servers, networks, digital circuits, analog circuits, combinations thereof, or other now known or later developed devices for analyzing and processing data. The processor 202 may implement a software program, such as code generated manually or programmed.

The computer system 200 may include memory, such as a memory 204 that can communicate via a bus 210. The memory 204 may be or include a main memory, a static memory, or a dynamic memory. The memory 204 may include any non-transitory memory device. The memory 204 may also include computer readable storage media such as various types of volatile and non-volatile storage media including random access memory, read-only memory, programmable read-only memory, electrically programmable read-only memory, electrically erasable read-only memory, flash memory, a magnetic tape or disk, optical media and the like. Also, the memory may include a non-transitory tangible medium upon which software may be stored. The software may be electronically stored as an image or in another format, such as through an optical scan, then compiled, or interpreted or otherwise processed or executed.

In one example, the memory 204 may include a cache or random access memory for the processor 202. In alternative examples, the memory 204 may be separate from the processor 202, such as a cache memory of a processor, the system memory, or other memory. The memory 204 may be or include an external storage device or database for storing data. Examples include a hard drive, compact disc (CD), digital video disc (DVD), memory card, memory stick, floppy disc, universal serial bus (USB) memory device, or any other device operative to store data. For example, the computer system 200 may also include a disk or optical drive unit 208. The drive unit 208 may include a computer-readable medium 222 in which one or more sets of software or instructions, such as the instructions 224, can be embedded. The processor 202 and the memory 204 may also include a computer-readable storage medium with instructions or software.

The memory 204 may be operable to store instructions executable by the processor 202. The functions, acts or tasks illustrated in the figures or described may be performed by the programmed processor 202 executing the instructions stored in the memory 204. The functions, acts or tasks may be independent of the particular type of instructions set, storage media, processor or processing strategy and may be performed by software, hardware, integrated circuits, firmware, microcode and the like, operating alone or in combination. Likewise, processing strategies may include multi-processing, multitasking, parallel processing and the like.

The instructions 224 may include the methods and/or logic described herein, including aspects or modules of the computer system 200 and/or one or more example components of the engine sound synthesis system, such as the sinusoidal signal estimation module 30. The instructions 224 may reside completely, or partially, in the memory 204 or in the processor 202 during execution by the computer system 200. For example, software aspects or modules of the engine sound synthesis system, such as the sinusoidal signal estimation module 30, may include examples of various signal processors that may reside completely, or partially, in the memory 204 or in the processor 202 during execution by the computer system 200.

With respect to various signal processors that may be used by the engine sound synthesis system, hardware or software implementations of such processors may include analog and/or digital signal processing modules and analog-to-digital and/or digital-to-analog converters. The analog signal processing modules may include linear electronic circuits such as passive filters, active filters, additive mixers, integrators and delay lines. Analog processing modules may also include non-linear circuits such as compandors, multiplicators (frequency mixers and voltage-controlled amplifiers), voltage-controlled filters, voltage-controlled oscillators and phase-locked loops. The digital or discrete signal processing modules may include sample and hold circuits, analog time-division multiplexers, analog delay lines and analog feedback shift registers, for example. In other implementations, the digital signal processing modules may include ASICs, field-programmable gate arrays or specialized digital signal processors (DSP chips). Either way, such digital signal processing modules may enhance an image signal via arithmetical operations that include fixed-point and floating-point, real-valued and complex-valued, multiplication, and/or addition. Other operations may be supported by circular buffers and/or look-up tables. Such operations may include Fast Fourier transform (FFT), finite impulse response (FIR) filter, infinite impulse response (IIR) filter, and/or adaptive filters.

Further, the computer system 200 may include a computer-readable medium that may include the instructions 224 or receives and executes the instructions 224 responsive to a propagated signal so that a device, can communicate voice, video, audio, images or any other data to the computer system 200 and/or another electronic device. The instructions 224 may be transmitted or received via a communication port or interface 220, or using a bus 210. The communication port or interface 220 may be a part of the processor 202 or may be a separate component. The communication port or interface 220 may be created in software or may be a physical connection in hardware. The communication port or interface 220 may be configured to connect with a network, external media, one or more input/output devices 214, or any other components in the computer system 200, or combinations thereof. The connection with a network may be a physical connection, such as a wired Ethernet connection or may be established wirelessly. The additional connections with other components of the computer system 200 may be physical connections or may be established wirelessly.

The communication interface 220 may include communication over wired networks, wireless networks, Ethernet AVB networks, a CAN bus, a MOST bus, or combinations thereof. The wireless network may be or include a cellular telephone network, an 802.11, 802.16, 802.20, 802.1Q or WiMax network. The wireless network may also include a wireless LAN, implemented via WI-FI or BLUETOOTH technologies. One or more components of the computer system 200 may communicate with each other by or through the communication interface 220.

The one or more input/output devices 214 may be configured to allow a user to interact with any of the components of the computer system 200. The one or more input/output devices 214 may include a keypad, a keyboard, a cursor control device, such as a mouse, or a joystick. Also, the one or more input/output devices 214 may include a microphone, one or more visual displays, speakers, remote controls, touchscreen displays or any other devices operative to interact with the computer system 200, such as any device operative to act as an interface between the computer system and one or more users and/or other electronic devices.

The term "computer-readable medium" may include a single storage medium or multiple storage media, such as a centralized or distributed database, or associated caches and servers that store one or more sets of instructions. The term "computer-readable medium" may also include any medium that is capable of storing, encoding or carrying a set of instructions for execution by a processor or that cause a computer system to perform any one or more of the methods or operations disclosed. The "computer-readable medium" may be non-transitory, and may be tangible.

In alternative examples, dedicated hardware implementations, such as application specific integrated circuits, programmable logic arrays and other hardware devices, may be constructed to implement various aspects of the system. One or more examples described may implement functions using two or more specific interconnected hardware modules or devices with related control and data signals that can be communicated between and through modules, or as portions of an application-specific integrated circuit. The system may encompass software, firmware, and hardware implementations.

The system described may be implemented by software programs executable by a computer system. Implementations can include distributed processing, component/object distributed processing, and parallel processing. Alternatively, virtual computer system processing can be constructed to implement various aspects of the system.

To clarify the use in the pending claims and to hereby provide notice to the public, the phrases "at least one of <A>, <B>, . . . and <N>" or "at least one of <A>, <B>, . . . <N>, or combinations thereof" are defined by the Applicant in the broadest sense, superseding any other implied definitions herebefore or hereinafter unless expressly asserted by the Applicant to the contrary, to mean one or more elements selected from the group comprising A, B, . . . and N, that is to say, any combination of one or more of the elements A, B, . . . or N including any one element alone or in combination with one or more of the other elements which may also include, in combination, additional elements not listed.

Although various exemplary embodiments of the engine sound synthesis system have been disclosed, it will be apparent to those skilled in the art that various changes and modifications can be made which will achieve some of the advantages of the system without departing from the spirit and scope of the engine sound synthesis system. It will be obvious to those reasonably skilled in the art that other components performing the same functions may be suitably substituted. Particularly, signal processing functions may be performed either in the time domain or in the frequency domain while achieving substantially equal results. It should be mentioned that features explained with reference to a specific figure may be combined with features of other figures, even in those where not explicitly been mentioned. Further, the methods of the engine sound synthesis system may be achieved in either all software implementations, using the appropriate processor instructions, or in hybrid implementations that utilize a combination of hardware logic and software logic to achieve the same results. Such modifications to the inventive concept are intended to be covered by the appended claims, and it will be apparent to those of ordinary skill in the art that many more embodiments and implementations are possible within the scope of the invention. Accordingly, the invention is not to be restricted except in light of the attached claims and their equivalents.

I claim:

1. A method for generating synthesized sound comprising;
   receiving an engine noise as an input signal with a processor;
   determining a fundamental frequency of the input signal with the processor using at least one of the input signal or at least one guide signal, and determining frequencies of higher harmonics of the fundamental frequency with the processor, thus determining with the processor harmonic model parameters associated with the determined frequencies;

synthesizing a harmonic signal with the processor based on the harmonic model parameters;

determining a residual signal with the processor by subtracting the harmonic signal from the input signal;

calculating residual model parameters with the processor based on the residual signal; and generating synthesized sound via a speaker in accordance with the harmonic model parameters and the residual model parameters.

2. The method of claim 1, wherein the input signal is transformed to a frequency domain, thus providing a frequency domain input signal before being further processed; and wherein the engine noise comprises the fundamental frequency, a harmonic contact associated with the fundamental frequency, and a broadband noise signal.

3. The method of claim 2, wherein the processing of the frequency domain input signal is fully performed in the frequency domain and thus the harmonic signal and the residual signal are calculated in the frequency domain.

4. The method of claim 1, wherein the fundamental frequency and the frequencies of the higher harmonics are derived from the least one guide signal by the processor; and wherein the at least one guide signal includes an engine speed signal.

5. The method of claim 4, wherein determining the harmonic model parameters includes:

fine-tuning the fundamental frequency and the frequencies of the higher harmonics obtained from the at least one guide signal; and wherein the engine speed signal corresponds to rotational speed of an engine producing the engine noise.

6. The method of claim 5, wherein the fine-tuning includes:

iteratively modifying the determined frequencies of the higher harmonics and their corresponding amplitude and phase values such that a norm of the residual signal is minimized.

7. The method of claim 4, wherein the harmonic model parameters include a frequency vector of the fundamental frequency and the frequencies of the higher harmonics, a corresponding magnitude vector, and a corresponding phase vector; and wherein the engine speed signal is obtained from a vehicle communication bus.

8. The method of claim 7, wherein the vehicle communication bus is a CAN bus.

9. The method of claim 1, further including:

filtering the residual signal to smooth the residual signal before estimating the residual model parameters.

10. The method of claim 1, wherein determining the residual model parameters includes:

calculating a power spectrum of the residual signal.

11. The method of claim 1, wherein determining the harmonic model parameters includes estimating phase and amplitude values associated with the fundamental frequency and the frequencies of the higher harmonics.

12. The method of claim 1, wherein the fundamental frequency :s further determined based on an active reverse gear.

13. The method of claim 1, wherein the synthesized sound is further based on One or more operating conditions of a vehicle.

14. The method of claim 1, wherein the fundamental frequency is further determined based on a gear number.

15. A method for synthesizing a sound signal comprising:

receiving at least one guide signal with a processor, the at least one guide signal including an engine speed signal and further vehicle parameters;

calculating with the processor a fundamental frequency and frequencies of a number of higher harmonies based on the engine speed signal;

obtaining residual model parameters and harmonic model parameters which are associated with the fundamental frequency and the frequencies of the higher harmonics:

synthesizing a harmonic signal with the processor using the harmonic model parameters for the calculated fundamental frequency and frequencies of the higher harmonics;

synthesizing a residual signal with the processor using the residual model parameters;

calculating a total sound signal by superposing the synthesized harmonic signal and the synthesized residual signal;

reproducing the total sound signal via a speaker.

16. The method of claim 15, further comprising:

adding pre-filtered white noise to the total sound signal; and wherein the residual model parameters and the harmonic model parameters, which are associated with the fundamental frequency and the frequencies of the higher harmonics, are obtained based on the at least one guide signal.

17. The method of claim 16, wherein the pre-filtered white noise is generated by a mapping of amplitude values of the white noise into a 0 to 2.pi. phase range, thus generating a phase signal to be added to the total sound signal.

18. The method of claim 15, wherein synthesizing the residual signal includes:

generating a noise signal having a power spectral density which corresponds to a power spectral density represented by the residual model parameters.

19. The method of claim 18, wherein the power spectral density is calculated for different frequency bands in accordance to a psycho-acoustically motivated frequency scale so as to consider psycho-acoustically critical band limits.

20. The method of claim 15, wherein a received engine noise signal corresponds to the engine speed signal.

21. The method of claim 15, wherein the fundamental frequency is further determined based on an active reverse gear.

22. The method of claim 15, wherein the engine speed signal is obtained from a vehicle communication bus.

23. The method of claim 22, wherein the vehicle communication bus is a CAN bus.

24. A system for generating synthesized sound comprising:

a processor;

a sinusoidal estimation module executable by the processor to calculate harmonic signal model parameters, the liar ionic signal model parameters comprising a sinusoidal signal having a fundamental frequency, and a plurality of harmonic sinusoidal signals having frequencies of a number of higher harmonics, the calculations based on at least one of a measured input signal and at least one guide signal, the at least one of the measured input signal including an engine noise, and the at least one guide signal including an engine RPM corresponding to the engine noise;

a synthesize harmonics module executable by the processor to synthesize an estimated harmonic portion of the measured input signal using the harmonic signal model parameters;

a residual signal extraction module executable by the processor to synthesize a residual signal based on a difference between the measured input signal and the estimated harmonic portion of the measured input signal;

a residual signal analysis module executable by the processor to perform signal analysis of the synthesized residual signal to calculate residual signal model parameters representing the residual signal; and a speaker, controlled by the processor to generate a synthesized sound;

where the harmonic signal model parameters and the residual signal model parameters are used to generate the synthesized sound.

25. The system of claim 24, where the sinusoidal estimation module comprises a fundamental frequency estimation unit executable by the processor and stored in memory to estimate the fundamental frequency, and a harmonic sinusoids estimation unit executable by the processor and stored in memory to estimate the plurality of harmonic sinusoidal signals; and wherein the engine noise comprises the fundamental frequency, the number or higher harmonics associated with the fundamental frequency, and a broadband noise signal.

26. The system of claim 24, where the sinusoidal estimation module includes a harmonic sinusoids generation module executable by the processor and stored in memory to derive the fundamental frequency, and the plurality of harmonic sinusoidal signals from the at least one guide signal, and the sinusoidal estimation module is executable by the processor and stored in memory to adaptively adjust the fundamental frequency and the plurality of harmonic sinusoidal signals to match the measured input signal.

27. The system of 24, further comprising a smoothing filter module disposed between the residual signal extraction module and the residual signal analysis module, the smoothing filter module executable by the processor and stored in memory to suppress transients n the synthesized residual signal prior to the signal analysis performed by the residual signal analysis module.

28. The system of claim 24, where the signal analysis performed by the residual signal analysis module is linear predictive coding, or calculation of a power spectrum of the residual signal.

29. The system of claim 24, wherein the engine RPM is obtained from a CAN bus.

30. The system of claim 24, wherein the synthesized sound is further based on one or more vehicle operating parameters.

31. The system of claim 24, wherein the higher harmonics are further based on a gear number.

32. The system of claim 24, wherein the fundamental frequency is further based on an active reverse gear.

* * * * *